United States Patent
Choi et al.

(10) Patent No.: US 6,835,529 B2
(45) Date of Patent: Dec. 28, 2004

(54) POLYMER HAVING BUTADIENE SULFONE REPEATING UNIT AND RESIST COMPOSITION COMPRISING THE SAME

(75) Inventors: Sang-jun Choi, Seoul (KR); Woo-sung Han, Seoul (KR); Sang-gyun Woo, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 106 days.

(21) Appl. No.: 10/384,727

(22) Filed: Mar. 11, 2003

(65) Prior Publication Data

US 2003/0180661 A1 Sep. 25, 2003

(30) Foreign Application Priority Data

Mar. 12, 2002 (KR) .................. 10-2002-0013265

(51) Int. Cl.[7] .......................... G03F 7/004; C08F 34/04
(52) U.S. Cl. .................... 430/270.1; 430/905; 430/910; 526/256; 526/271; 526/281; 526/319
(58) Field of Search ............... 430/270.1, 326, 430/905, 910; 526/256, 271, 319, 281

(56) References Cited

U.S. PATENT DOCUMENTS 4,994,580 A * 2/1991 Stahly .................. 548/461

2003/0022100 A1 * 1/2003 Lee et al. ................. 430/270.1

\* cited by examiner

*Primary Examiner*—Rosemary Ashton
(74) *Attorney, Agent, or Firm*—Lee & Sterba, P.C.

(57) ABSTRACT

A polymer having a repeating unit comprising a copolymer of butadiene sulfone and maleic anhydride, and a chemically amplified resist composition comprising the polymer. The resist composition includes a photosensitive polymer having a first repeating unit comprising a copolymer of butadiene sulfone and maleic anhydride, the first repeating unit represented by a formula:

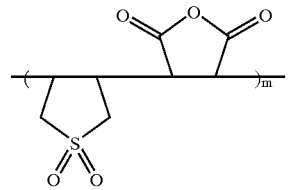

and a second repeating unit copolymerized with the first repeating unit.

54 Claims, No Drawings

POLYMER HAVING BUTADIENE SULFONE REPEATING UNIT AND RESIST COMPOSITION COMPRISING THE SAME

BACKGROUND OF THE INVENTION

1. Field of the Invention

The present invention generally relates to a polymer which can be used as a photolithography processing material and a resist composition comprising the same. More particularly, the present invention relates to a novel polymer having a high level of transmittance at deep ultraviolet (DUV) from a next-generation ArF excimer laser (193 nm), and a chemically amplified resist composition comprising the same.

2. Description of the Related Art

As the integration density and complexity of semiconductor devices continue to increase, the ability to form ultra-fine patterns becomes more and more critical. For example, in 1-Gigabit or higher semiconductor devices, a pattern size having a design rule of 0.1 µm or less is needed. When a conventional photoresist material is exposed with a KrF excimer laser (248 nm), however, it is difficult to form such fine patterns. For this reason, a lithography technique using an ArF excimer laser (193 nm) generating at a wavelength that is shorter than the wavelength of a KrF excimer laser, has been actively researched. With this research into ArF excimer lasers, new resist materials that would be compatible with ArF excimer lasers are needed and required.

Polymer materials used in photolithography are required to meet the following requirements: (1) high transparency for the corresponding light source; (2) high resistance against a plasma used during a dry etching process; (3) good adhesion to underlying layers to avoid pattern collapse; and (4) capability of being developed using a conventional developer.

To date, several resist materials for use in lithography using ArF excimer laser have been found, and representative examples thereof include polymers prepared from poly(meth)acrylate, cycloolefin-maleic anhydride (COMA), polynorbornene and the like. However, these polymers have several limitations in satisfying the above requirements. Particularly, these polymer materials may have very low transparency, a very weak resistance against a dry etching process, and poor adhesion to underlying layers. Thus, these conventional resist materials still have several drawbacks and present problems in commercial use with ArF excimer lasers.

SUMMARY OF THE INVENTION

According to an embodiment of the present invention, there is provided a polymer having a structure which can be prepared by a simple method and has a high transmittance, improved dry etching resistance and good adhesiveness when used as a resist composition material.

Another feature of an embodiment of the present invention provides a resist composition which provides a high transmittance in lithography, good dry etching resistance, and good adhesiveness to underlying layers, that may be advantageously used for realizing very small pattern sizes as well as easily employed for commercial use with ArF excimer lasers without the drawbacks and problems of conventional resist materials.

According to another feature of an embodiment of the present invention, there is provided a polymer having a repeating unit comprising a copolymer of butadiene sulfone and maleic anhydride, the copolymer represented by a Formula 1:

[Formula 1]

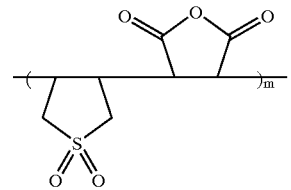

In another embodiment of the present invention, the polymer includes (a) a first repeating unit comprising a copolymer of butadiene sulfone and maleic anhydride, the copolymer being represented by a Formula 1, and (b) a second repeating unit copolymerized with the first repeating unit.

The polymer according to the present invention has a weight average molecular weight of 3,000 to 30,000.

The second repeating unit includes a hydroxy, carboxyl, or acid-labile group. The second repeating unit is a polymerization product obtained from at least one monomer selected from-the group consisting of acrylate, methacrylate, norbornene, alkyl vinyl ether, vinyl acetate, acrolein, methacrolein, acrylonitrile and methacrylonitrile.

Alternatively, the polymer according to another embodiment of the present invention may have a Formula 2:

[Formula 2]

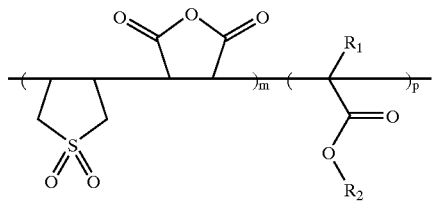

wherein $R_1$ is a hydrogen atom or a methyl group, $R_2$ is a substituted or unsubstituted $C_1$–$C_{20}$ hydrocarbon group, $m/(m+p)=0.5$ to 0.8, and $p/(m+p)=0.2$ to 0.5. Preferably, $R_2$ is t-butyl, tetrahydropyranyl or 1-ethoxyethyl. Also, $R_2$ is preferably a $C_4$–$C_{20}$ acid-labile alicyclic group, exemplified by 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

According to another embodiment of the present invention, the polymer may have a formula 3:

[Formula 3]

wherein $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, $m/(m+q)=0.5$ to $0.8$, and $q/(m+q)=0.2$ to $0.5$. Preferably, $R_3$ is t-butyl ester, tetrahydropyranyl ester or 1-ethoxyethyl ester. Also, $R_3$ is a preferably $C_4$–$C_{20}$ acid-labile alicyclic ester group, exemplified by 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 1-adamantyl-1-methylethyl ester, 2-methyl-2-fenchyl ester or 2-ethyl-2-fenchyl ester.

According to still another embodiment of the present invention, the polymer may have a Formula 4:

[Formula 4]

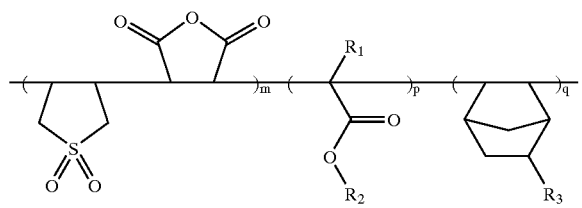

wherein, $R_1$ is a hydrogen atom or a methyl group, $R_2$ is a substituted or unsubstituted $C_1$–$C_{20}$ hydrocarbon group, $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, $m/(m+p+q)=0.3$ to $0.8$, $p/(m+p+q)=0.1$ to $0.4$ and, $q/(m+p+q)=0.1$ to $0.3$. At least one of $R_2$ and $R_3$ includes an acid-labile group.

According to another feature of an embodiment of the present invention, there is provided a resist composition comprising (a) a photosensitive polymer including a repeating unit comprising a copolymer of butadiene sulfone and maleic anhydride, the copolymer represented by the formula 1, and (b) a photoacid generator (PAG).

The amount of the PAG is preferably from about 1 to about 15 wt % based on the weight of the photosensitive polymer. Preferably, the PAG includes triarylsulfonium salts, diaryliodonium salts, or mixtures thereof. More preferably, the PAG includes triphenylsulfonium triflate, diphenyliodonium triflate, di-t-butyldiphenyliodonium triflate, or mixtures thereof.

The resist composition according to an embodiment of the present invention may further include an organic base. The amount of the organic base is preferably from about 0.01 to about 2.0 wt % based on the weight of the photosensitive polymer. Preferably, the organic base includes a tertiary amine compound. More preferably, the organic base comprises triethylamine, triisobutylamine, triisooctylamine, diethanolamine, triethanolamine, or a mixture thereof.

The resist composition according to another embodiment of the present invention comprises: (a) a photosensitive polymer comprising: (a-1) a first repeating unit comprising a copolymer of butadiene sulfone and maleic anhydride, the copolymer represented by the formula 1, and (a-2) a second repeating unit copolymerized with the first repeating unit, and (b) a photoacid generator (PAG).

The second repeating unit includes a hydroxy, carboxyl, or acid-labile group. The second repeating unit is a polymerization product obtained from at least one monomer selected from the group consisting of acrylate, methacrylate, norbornene, alkyl vinyl ether, vinyl acetate, acrolein, methacrolein, acrylonitrile and methacrylonitrile.

The polymer according to the present invention has a repeating unit comprising a copolymer of strongly hydrophobic butadiene sulfone and maleic anhydride, thereby exhibiting good adhesiveness when used as a resist composition material.

The polymer of the present invention provides a high transparency at a deep ultraviolet (DUV) region and has good wettability to generally used developer solutions. Therefore, the resist composition prepared therefrom can be developed using conventional developer solutions. Also, the resist composition has excellent dry etching resistance, a high transmittance and good adhesion to the underlying layer, thereby exhibiting desirable lithographic performance.

DETAILED DESCRIPTION OF THE INVENTION

Korean Patent Application No. 2002-13265, filed on Mar. 12, 2002, and entitled: "Polymer Having Butadiene Sulfone Repeating Unit and Resist Composition Comprising the Same," is incorporated by reference herein in its entirety.

The present invention will now be described more fully hereinafter relative to preferred embodiments of the invention. The invention may, however, be embodied in different forms and should not be construed as limited to the embodiments set forth herein. Rather, these embodiments are provided so that this disclosure will be thorough and complete, and will fully convey the scope of the invention to those skilled in the art.

EXAMPLE 1

Synthesis of poly(butadiene sulfone)-(maleic anhydride) (BS-MA) copolymer

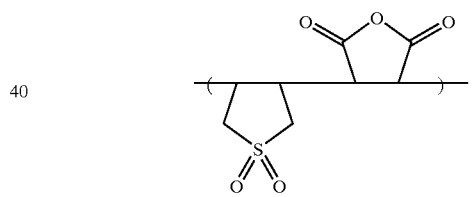

1.2 g (10 mmol) of butadiene sulfone (BS), 1.0 g (10 mmol) of maleic anhydride (MA), and 5 mol % of azobisisobutyronitrile (AIBN) were dissolved in 4 g of tetrahydrofurane (THF), completely degassed using a nitrogen gas, and followed by polymerizing at approximately 65° C. for about 12 hours.

After polymerization, the reaction product was slowly precipitated in a mixed solution of excess n-hexane and isopropyl alcohol (IPA) in a mixture ratio of 8:2, and filtered. The filtrate was dissolved again in an appropriate amount of THF to then be reprecipitated in n-hexane, and the obtained filtrate was dried in a vacuum oven maintained at 50° C. for about 24 hours to provide a desired copolymer with a yield of 50%.

The resultant product had a weight average molecular weight (Mw) of 7,600 and a polydispersity (Mw/Mn) of 1.9.

EXAMPLE 2

Synthesis of poly(butadien sulfone)-(maleic anhydride)-(t-butyl methacrylate) (BS-MA-tBMA) terpolymer

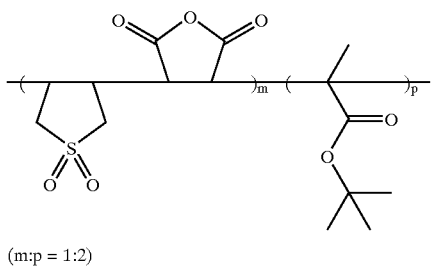

(m:p = 1:2)

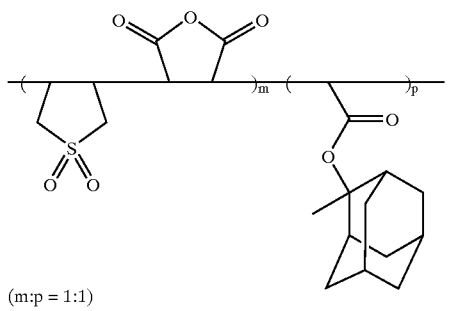

(m:p = 1:1)

1.2 g (10 mmol) of BS, 1.0 g (10 mmol) of MA, 2.8 g (20 mmol) of t-butyl methacrylate (tBMA) and 5 mol % of AIBN were dissolved in 10 g of THF, completely degassed using a nitrogen gas, and then polymerized at approximately 65° C. for about 8 hours.

After polymerization, the reaction product was slowly precipitated in excess IPA, and filtered. The filtrate was dissolved again in an appropriate amount of THF to then be reprecipitated in n-hexane, and the obtained filtrate was dried in a vacuum oven maintained at 50° C. for about 24 hours to provide a desired copolymer with a yield of 70%.

The resultant product had a weight average molecular weight (Mw) of 9,300 and a polydispersity (Mw/Mn) of 1.8.

EXAMPLE 3

Synthesis of poly(butadien sulfone)-(maleic anhydride)-(2-methyl-2-adamantyl methacrylate) (BS-MA-MAMA) terpolymer

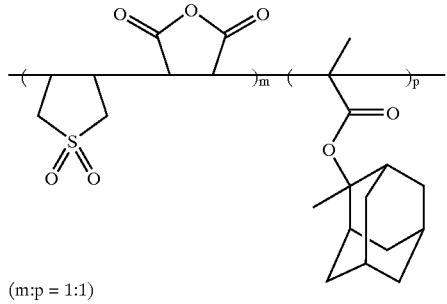

(m:p = 1:1)

1.2 g (10 mmol) of BS, 1.0 g (10 mmol) of MA, 2.34 g (10 mmol) of 2-methyl-2-adamantyl methacrylate (MAMA) and 5 mol % of AIBN were dissolved in 8 g of THF, and polymerized in the same manner as in Example 2 to provide a desired polymer with a yield of 65%.

The resultant product had a weight average molecular weight (Mw) of 8,900 and a polydispersity (Mw/Mn) of 1.8.

EXAMPLE 4

Synthesis of poly(butadiene sulfone)-(maleic anhydride)-(2-methyl-2-adamantyl acrylate) (BS-MA-MAA) terpolymer 1.2 g (10 mmol) of BS, 1.0 g (10 mmol) of MA, 2.2 g (10 mmol) of 2-methyl-2-adamantyl acrylate (MAA) and 5 mol % of AIBN were dissolved in 8 g of THF, and polymerized in the same manner as in Example 2 to provide a desired polymer with a yield of 65%.

The resultant product had a weight average molecular weight (Mw) of 10,600 and a polydispersity (Mw/Mn) of 1.9.

EXAMPLE 5

Synthesis of poly(butadien sulfone)-(maleic anhydride)-(2-ethyl-2-adamantyl methacrylate) (BS-MA-EAMA) terpolymer

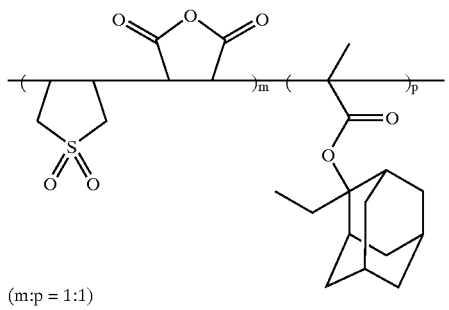

(m:p = 1:1)

1.2 g (10 mmol) of BS, 1.0 g (10 mmol) of MA, 2.5 g (10 mmol) of 2-ethyl-2-adamantyl methacrylate (EAMA) and 5 mol % of AIBN were dissolved in 10 g of THF, and polymerized in the same manner as in Example 2 to provide a desired polymer with a yield of 65%.

The resultant product had a weight average molecular weight (Mw) of 9,200 and a polydispersity (Mw/Mn) of 1.8.

EXAMPLE 6

Synthesis of poly(butadien sulfone)-(maleic anhydride)-(8-ethyl-2-tricyclodecyl methacrylate) (BS-MA-ETCDMA) terpolymer

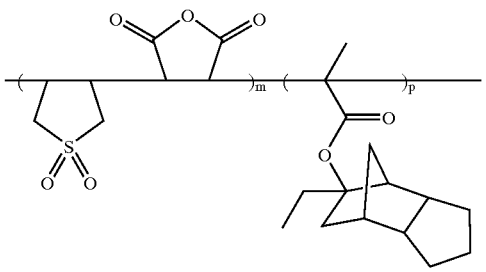

(m:p = 1:1)

1.2 g (10 mmol) of BS, 1.0 g (10 mmol) of MA, 2.5 g (10 mmol) of 8-ethyl-8-tricyclodecyl methacrylate (ETCDMA)

and 5 mol % of AIBN were dissolved in 10 g of THF, and polymerized in the same manner as in Example 2 to provide a desired polymer with a yield of 65%.

The resultant product had a weight average molecular weight (Mw) of 9,800 and a polydispersity (Mw/Mn) of 1.9.

EXAMPLE 7

Synthesis of poly(butadien sulfone)-(maleic anhydride)-(t-butyl 5-norbornene-2-carboxylate) (BS-MA-NB-tBNC) terpolymer

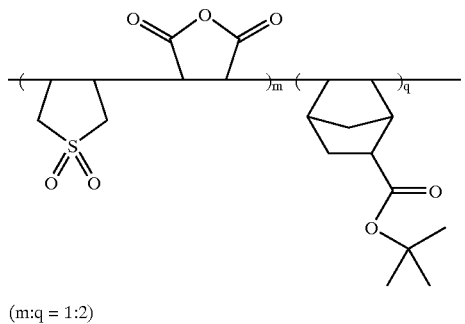

(m:q = 1:2)

1.2 g (10 mmol) of BS, 3.0 g (10 mmol) of MA, 3.9 g (30 mmol) of t-butyl 5-norbornene-2-carboxylate (t-BNC) and 5 mol % of AIBN were dissolved in 16 g of THF, and polymerized in the same manner as in Example 2 to provide a desired polymer with a yield of 50%.

The resultant product had a weight average molecular weight (Mw) of 6,800 and a polydispersity (Mw/Mn) of 1.9.

EXAMPLE 8

Synthesis of poly(butadiene sulfone)-(maleic anhydride)-(norbornene)-(2-methyl-2-adamantyl methacrylate) (BS-MA-NB-MAMA) tetrapolymer

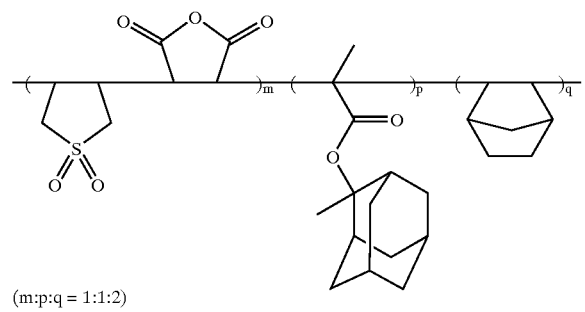

(m:p:q = 1:1:2)

1.2 g (10 mmol) of BS, 2.0 g (20 mmol) of MA, 0.95 g (10 mmol) of norbornene (NB), 4.7 g (20 mmol) of MAMA and 5 mol % of AIBN were dissolved in 18 g of THF, and polymerized in the same manner as in Example 2 to give a desired polymer with a yield of 65%.

The resultant product had a weight average molecular weight (Mw) of 8,800 and a polydispersity (Mw/Mn) of 1.8.

As described above, terpolymer or tetrapolymer photosensitive polymers can be easily prepared by introducing various acrylate, methacrylate or norbornene derivatives having an acid-labile protecting group to a BS-MA copolymer for polymerization. An appropriate proportion of the repeating unit having an acid-labile protecting group is approximately 10 to 40 mol % based on the total weight of the polymer. The resultant product had a weight average molecular weight (Mw) in a range from about 3,000 to about 30,000 and a polydispersity (Mw/Mn) in a range from about 1.5 to about 2.5.

EXAMPLE 9

Preparation of Resist Composition 1.0 g of each of the polymers synthesized in the above described Examples 2–8 and 10–20 mg of triphenylsulfonium triflate or triphenylsulfonium nonaflate as a photoacid generator (PAG) were dissolved in 8.0 g of a cyclohexanone or proplylene glycol monomethyl ether acetate (PGMEA) solvent, and 2 mg of triisooctylamine as an organic base was added thereto for complete dissolution, followed by filtering using a 0.2 μm membrane filter, to provide each respective resist composition.

A silicon (Si) wafer treated with an anti-reflective coating was coated with each respective resist composition to a thickness of approximately 0.3 μm.

Thereafter, the coated wafer was soft-baked at a temperature of 120° C. for approximately 90 seconds, and exposed using an ArF excimer laser stepper (NA=0.6, σ=0.75), followed by performing post-exposure baking at 120° C. for approximately 60 seconds.

Next, development is performed using 2.38% by weight of a tetramethylammonium hydroxide (TMAH) solution for approximately 60 seconds to form a resist pattern.

The results showed that a 140 to 160 nm, clean line-and-space pattern was obtained at an exposure dose of approximately 8 to 25 mJ/cm².

Table 1 shows a summary of the observed results of the resist patterns obtained from the respective resist compositions prepared in Examples 2–8, showing the minimum range of each line and space pattern for each dose.

TABLE 1

| Example | PAG | Dose (mJ/cm²) | Resolution power (nm) |
|---|---|---|---|
| 2 | Triphenylsulfonium triflate (10 mg) | 8 | 160 |
| 3 | Triphenylsulfonium triflate (5 mg) + Triphenylsulfonium nonaflate (10 mg) | 11 | 140 |
| 4 | Triphenylsulfonium triflate (10 mg) | 8 | 160 |
| 5 | Triphenylsulfonium triflate (10 mg) | 10 | 150 |
| 6 | Triphenylsulfonium triflate (10 mg) | 13 | 150 |
| 7 | Triphenylsulfonium triflate (10 mg) | 11 | 140 |
| 8 | Triphenylsulfonium triflate (10 mg) | 13 | 160 |

The polymer according to the present invention includes a repeating unit comprising a copolymer of strongly hydrophobic butadiene sulfone and maleic anhydride, thereby exhibiting good adhesion to underlying layers when used as a resist composition material, and providing a high level of transparency due to relatively low absorptivity at a deep ultraviolet (DUV) region. Also, the copolymer of butadiene sulfone and maleic anhydride has good wettability to a developer solution. Further, the resist composition according to the present invention produces polymers having three or more monomer units, such as terpolymer, tetrapolymer and the like, using a copolymer butadiene sulfone and maleic anhydride and a repeating unit having an acid-labile protecting group, such as acrylate, methacrylate or norbornene derivative. The resist composition according to the present invention can be easily obtained by generally known radical polymerization, and further increases resistance to dry etching by introducing an alicyclic group. Therefore, the resist composition according to the present invention exhibits excellent lithographic performance, so that it can be used in manufacturing next-generation semiconductor devices.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A polymer having a repeating unit comprising a copolymer of butadiene sulfone and maleic anhydride, the copolymer represented by a formula:

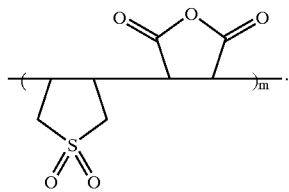

2. The polymer as claimed in claim 1, wherein the polymer has a weight average molecular weight of from about 3,000 to about 30,000.

3. A polymer comprising:

A. a first repeating unit comprising a copolymer of butadiene sulfone and maleic anhydride, the copolymer represented by a formula:

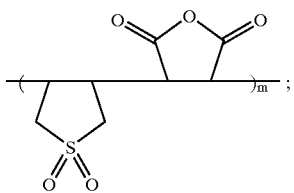

and

B. a second repeating unit copolymerized with the first repeating unit.

4. The polymer as claimed in claim 3, wherein the polymer has a weight average molecular weight from about 3,000 to about 30,000.

5. The polymer as claimed in claim 3, wherein the second repeating unit includes a hydroxy, carboxyl, or acid-labile group.

6. The polymer as claimed in claim 3, wherein the second repeating unit is a polymerization product obtained from at least one monomer selected from the group consisting of acrylate, methacrylate, norbornene, alkyl vinyl ether, vinyl acetate, acrolein, methacrolein, acrylonitrile and methacrylonitrile.

7. The polymer as claimed in claim 3, wherein the polymer is represented by a formula:

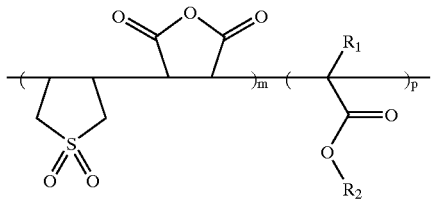

wherein $R_1$ is a hydrogen atom or a methyl group, $R_2$ is a substituted or unsubstituted $C_1$–$C_{20}$ hydrocarbon group, m/(m+p)=0.5 to 0.8, and p/(m+p)=0.2 to 0.5.

8. The polymer of claim 7, wherein $R_2$ is t-butyl, tetrahydropyranyl or 1-ethoxyethyl.

9. The polymer of claim 7, wherein $R_2$ is a $C_4$–$C_{20}$ acid-labile alicyclic group.

10. The polymer of claim 9, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

11. The polymer as claimed in claim 3, wherein the polymer is represented by a formula:

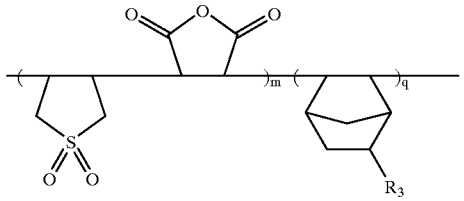

wherein $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, m/(m+q)=0.5 to 0.8, and q/(m+q)=0.2 to 0.5.

12. The polymer as claimed in claim 11, wherein $R_3$ is t-butyl ester, tetrahydropyranyl ester or 1-ethoxyethyl ester.

13. The polymer as claimed in claim 11, wherein $R_3$ is a $C_4$–$C_{20}$ acid-labile ester group.

14. The polymer as claimed in claim 13, wherein $R_3$ is 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 1-adamantyl-1-methylethyl ester, 2-methyl-2-fenchyl ester or 2-ethyl-2-fenchyl ester.

15. The polymer as claimed in claim 3, wherein the polymer is represented by a formula:

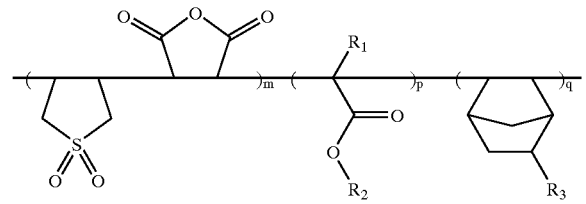

wherein, $R_1$ is a hydrogen atom or a methyl group, $R_2$ is a substituted or unsubstituted $C_1$–$C_{20}$ hydrocarbon group, $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, m/(m+p+q)=0.3 to 0.8, p/(m+p+q)=0.1 to 0.4 and, q/(m+p+q)=0.1 to 0.3.

16. The polymer as claimed in claim 15, wherein $R_2$ is t-butyl, tetrahydropyranyl or 1-ethoxyethyl.

17. The polymer as claimed in claim 15, wherein $R_3$ is t-butyl ester, tetrahydropyranyl ester or 1-ethoxyethyl ester.

18. The polymer as claimed in claim 15, wherein at least one of $R_2$ and $R_3$ includes an acid-labile alicyclic group.

19. The polymer as claimed in claim 18, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

20. The polymer of claim 18, wherein $R_3$ is 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 1-adamantyl-1-methylethyl ester, 2-methyl-2-fenchyl ester or 2-ethyl-2-fenchyl ester.

21. A resist composition comprising:
A. a photosensitive polymer including a repeating unit comprising a copolymer of butadiene sulfone and maleic anhydride, the copolymer represented by the formula:

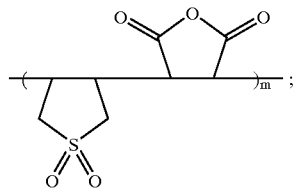

and
B. a photoacid generator (PAG).

22. The resist composition as claimed in claim 21, wherein the photosensitive polymer has a weight average molecular weight from about 3,000 to about 30,000.

23. The resist composition as claimed in claim 21, wherein the amount of the PAG is from about 1 to about 15 wt % based on the weight of the photosensitive polymer.

24. The resist composition as claimed in claim 21, wherein the PAG includes triarylsulfonium salts, diaryliodonium salts, or mixtures thereof.

25. The resist composition as claimed in claim 21, wherein the PAG includes triphenylsulfonium triflate, diphenyliodonium triflate, di-t-butyldiphenyliodonium triflate, or mixtures thereof.

26. The resist composition as claimed in claim 21, further comprising an organic base.

27. The resist composition as claimed in claim 26, wherein the amount of the organic base is from about 0.01 to about 2.0 wt % based on the weight of the photosensitive polymer.

28. The resist composition as claimed in claim 26, wherein the organic base includes a tertiary amine compound.

29. The resist composition as claimed in claim 28, wherein the organic base comprises triethylamine, triisobutylamine, triisooctylamine, diethanolamine, triethanolamine, or a mixture thereof.

30. A resist composition, comprising:
A. a photosensitive polymer, comprising:
(A-1) a first repeating unit comprising a copolymer of butadiene sulfone and maleic anhydride, the copolymer represented by a formula:

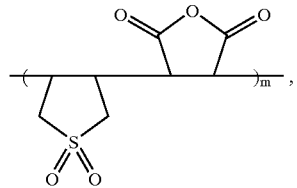

and
(A-2) a second repeating unit copolymerized with the first repeating unit; and
B. a photoacid generator (PAG).

31. The resist composition as claimed in claim 30, wherein the photosensitive polymer has a weight average molecular weight from about 3,000 to about 30,000.

32. The resist composition as claimed in claim 30, wherein the second repeating unit includes a hydroxy, carboxyl, or acid-labile group.

33. The resist composition as claimed in claim 30, wherein the second repeating unit is a polymerization product obtained from at least one monomer selected from the group consisting of acrylate, methacrylate, norbornene, alkyl vinyl ether, vinyl acetate, acrolein, methacrolein, acrylonitrile and methacrylonitrile.

34. The resist composition as claimed in claim 30, wherein the photosensitive polymer has a formula:

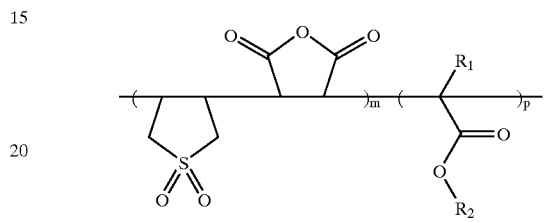

wherein $R_1$ is a hydrogen atom or a methyl group, $R_2$ is a substituted or unsubstituted $C_1$–$C_{20}$ hydrocarbon group, m/(m+p)=0.5 to 0.8, and p/(m+p)=0.2 to 0.5.

35. The resist composition as claimed in claim 34, wherein $R_2$ is t-butyl, tetrahydropyranyl or 1-ethoxyethyl.

36. The resist composition as claimed in claim 34, wherein $R_2$ is a $C_4$–$C_{20}$ acid-labile alicyclic group.

37. The resist composition as claimed in claim 36, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

38. The resist composition as claimed in claim 30, wherein the photosensitive polymer has a formula:

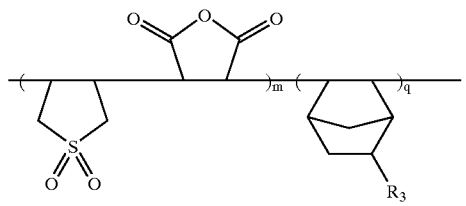

wherein $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, m/(m+q)=0.5 to 0.8, and q/(m+q)=0.2 to 0.5.

39. The resist composition as claimed in claim 38, wherein $R_3$ is t-butyl ester, tetrahydropyranyl ester or 1-ethoxyethyl ester.

40. The resist composition as claimed in claim 39, wherein $R_3$ is a $C_4$–$C_{20}$ acid-labile alicyclic ester group.

41. The resist composition as claimed in claim 40, wherein $R_3$ is 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 1-adamantyl-1-methylethyl ester, 2-methyl-2-fenchyl ester or 2-ethyl-2-fenchyl ester.

42. The resist composition as claimed in claim 38, wherein the photosensitive polymer has a formula:

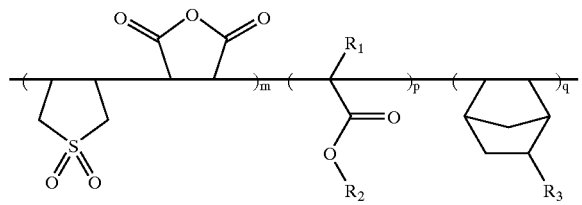

wherein, $R_1$ is a hydrogen atom or a methyl group, $R_2$ is a substituted or unsubstituted $C_1$–$C_{20}$ hydrocarbon group, $R_3$ is a hydrogen atom, a hydroxy, carboxyl, halide, nitrile, alkyl, alkoxy, sulfonate, or a substituted or unsubstituted $C_1$–$C_{20}$ acid-labile hydrocarbon group, m/(m+p+q)=0.3 to 0.8, p/(m+p+q)=0.1 to 0.4 and, q/(m+p+q)=0.1 to 0.3.

43. The resist composition as claimed in claim 42, wherein $R_2$ is t-butyl, tetrahydropyranyl or 1-ethoxyethyl.

44. The resist composition as claimed in claim 42, wherein $R_3$ is t-butyl ester, tetrahydropyranyl ester or 1-ethoxyethyl ester.

45. The resist composition as claimed in claim 42, wherein at least one of $R_2$ and $R_3$ includes an acid-labile alicyclic group.

46. The resist composition as claimed in claim 45, wherein $R_2$ is a 2-methyl-2-norbornyl, 2-ethyl-2-norbonyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

47. The resist composition as claimed in claim 45, wherein $R_3$ is 2-methyl-2-norbornyl ester, 2-ethyl-2-norbonyl ester, 2-methyl-2-isobornyl ester, 2-ethyl-2-isobornyl ester, 8-methyl-8-tricyclo[5.2.1.0$^{2,6}$]decanyl ester, 8-ethyl-8-tricyclo[5.2.1.0$^{2,6}$]decanyl ester, 2-methyl-2-adamantyl ester, 2-ethyl-2-adamantyl ester, 1-adamantyl-1-methylethyl ester, 2-methyl-2-fenchyl ester or 2-ethyl-2-fenchyl ester.

48. The resist composition as claimed in claim 30, wherein the amount of the PAG is from about 1 to about 15 wt % based on the weight of the photosensitive polymer.

49. The resist composition as claimed in claim 30, wherein the PAG includes triarylsulfonium salts, diaryliodonium salts, or mixtures thereof.

50. The resist composition as claimed in claim 30, wherein the PAG includes triphenylsulfonium triflate, diphenyliodonium triflate, di-t-butyldiphenyliodonium triflate, or mixtures thereof.

51. The resist composition as claimed in claim 30, further comprising an organic base.

52. The resist composition as claimed in claim 51, wherein the amount of the organic base is from about 0.01 to about 2.0 wt % based on the weight of the photosensitive polymer.

53. The resist composition as claimed claim 51, wherein the organic base includes a tertiary amine compound.

54. The resist composition as claimed in claim 51, wherein the organic base comprises triethylamine, triisobutylamine, triisooctylamine, diethanolamine, triethanolamine, or a mixture thereof.

* * * * *